(12) United States Patent
Mok

(10) Patent No.: US 11,289,452 B2
(45) Date of Patent: Mar. 29, 2022

(54) COMPONENT CARRIER AND METHOD OF MANUFACTURING THE SAME

(71) Applicant: AT&S (Chongqing) Company Limited, Chongqing (CN)

(72) Inventor: Jeesoo Mok, Chongqing (CN)

(73) Assignee: AT&S (Chongqing) Company Limited, Chongqing (CN)

( * ) Notice: Subject to any disclaimer, the term of this patent is extended or adjusted under 35 U.S.C. 154(b) by 21 days.

(21) Appl. No.: 16/689,213

(22) Filed: Nov. 20, 2019

(65) Prior Publication Data

US 2020/0161279 A1    May 21, 2020

(30) Foreign Application Priority Data

Nov. 20, 2018 (CN) .......................... 201811386332.2

(51) Int. Cl.
*H01L 25/065* (2006.01)
*H01L 21/56* (2006.01)
(Continued)

(52) U.S. Cl.
CPC .......... *H01L 25/0657* (2013.01); *H01L 21/56* (2013.01); *H01L 23/28* (2013.01);
(Continued)

(58) Field of Classification Search
CPC ............. H01L 25/0657; H01L 23/5389; H01L 23/5384; H01L 25/0652; H01L 23/28; H01L 21/56; H01L 2924/3511; H01L 24/96; H01L 2021/6027; H01L 23/13; H01L 2924/15311; H01L 2924/1434; H01L 21/4857
(Continued)

(56) References Cited

U.S. PATENT DOCUMENTS 9,443,839 B2    9/2016 Lotfi et al.
10,043,758 B1   8/2018 Lee et al.
(Continued)

FOREIGN PATENT DOCUMENTS

CN    106960827 A    7/2017
CN    107863333 A    3/2018
(Continued)

OTHER PUBLICATIONS

Extended European Search Report in Application 19208850.8; dated Feb. 19, 2020; pp. 1-7; European Patent Office, 80298, Munich, Germany.
(Continued)

*Primary Examiner* — Jasmine J Clark
(74) *Attorney, Agent, or Firm* — Robert A. Blaha; Smith Tempel Blaha LLC

(57) ABSTRACT

A method of manufacturing a component carrier includes a step of stacking and connecting a first component and a second component to one another to form a cluster and thereafter, a step of inserting the cluster into a cavity of a base structure. A component carrier has a base structure with a cavity; a cluster having a first component stacked and connected with a second component, wherein the cluster is arranged in the cavity. A height difference between opposing lateral sidewalls of the cluster is less than 15 μm.

21 Claims, 6 Drawing Sheets

(51) Int. Cl.
*H01L 23/28* (2006.01)
*H01L 23/538* (2006.01)
*H01L 21/60* (2006.01)

(52) U.S. Cl.
CPC ...... *H01L 23/5384* (2013.01); *H01L 23/5385* (2013.01); *H01L 2021/6027* (2013.01)

(58) Field of Classification Search
USPC .......................................................... 257/777
See application file for complete search history.

(56) References Cited

U.S. PATENT DOCUMENTS

| | | | |
|---|---|---|---|
| 10,043,772 | B2 | 8/2018 | Lee et al. |
| 10,045,436 | B2 | 8/2018 | Cho et al. |
| 10,045,444 | B2 | 8/2018 | Lee et al. |
| 10,050,016 | B2 | 8/2018 | Lee et al. |
| 10,061,967 | B2 | 8/2018 | Baek et al. |
| 10,062,652 | B2 | 8/2018 | Lee et al. |
| 2009/0051024 | A1 | 2/2009 | Chia |
| 2009/0071705 | A1 | 3/2009 | Kim et al. |
| 2010/0242272 | A1 | 9/2010 | Kim et al. |
| 2011/0116246 | A1 | 5/2011 | Lee et al. |
| 2011/0140257 | A1 | 6/2011 | Sweeney et al. |
| 2011/0164391 | A1 | 7/2011 | Shin et al. |
| 2012/0037411 | A1 | 2/2012 | Hsu et al. |
| 2012/0291274 | A1 | 11/2012 | Lee et al. |
| 2014/0353006 | A1 | 12/2014 | Lee |
| 2015/0282301 | A1 | 10/2015 | Nishida et al. |
| 2015/0334842 | A1 | 11/2015 | Shimabe et al. |
| 2016/0099213 | A1* | 4/2016 | Tae ........................ H01L 24/82 257/777 |
| 2016/0276308 | A1 | 9/2016 | Min et al. |
| 2017/0372980 | A1 | 12/2017 | Kurahashi |
| 2018/0151392 | A1 | 5/2018 | Chew |
| 2020/0161279 | A1 | 5/2020 | Mok |

FOREIGN PATENT DOCUMENTS

| | | |
|---|---|---|
| CN | 108109985 A | 6/2018 |
| EP | 1 915 038 A1 | 4/2008 |
| EP | 3657541 A1 | 5/2020 |

OTHER PUBLICATIONS

Office Action in Application No. 201811386332.2 in China; pp. 1-24; Mar. 24, 2021; China National Intellectual Property Administration; 6 Xitucheng Lu, Jimenqiao, Haidian District, Beijing 100088 China.

Translation of Cover Page of First Office Action in Application No. 201811386332.2 in China; pp. 1-3; Mar. 24, 2021; China National Intellectual Property Administration; 6 Xitucheng Lu, Jimenqiao, Haidian District, Beijing 100088 China.

* cited by examiner

COMPONENT CARRIER AND METHOD OF MANUFACTURING THE SAME

CROSS-REFERENCE TO RELATED APPLICATION

This application claims the benefit of the filing date of Chinese Patent Application No. 201811386332.2 filed Nov. 20, 2018, the disclosure of which is hereby incorporated herein by reference.

TECHNICAL FIELD

Embodiments of the invention generally relate to a component carrier and to method of manufacturing the same.

TECHNOLOGICAL BACKGROUND

A fan-out Wafer Level Packaging (FOWLP) is one of the latest packaging trends in microelectronics. It has a high potential for significant package miniaturization concerning package volume but also its thickness. Techno-logical core of FOWLP is the formation of a reconfigured molded wafer combined with a thin film redistribution layer to yield an SMD-compatible package. Main advantages of FOWLP are the substrate-less package, low thermal resistance, improved RF performance due to shorter interconnections together with a direct IC connection by thin film metallization instead of wire bonds or flip chip bumps and lower parasitic effects. Especially the inductance of FOWLP is much lower compared to FC-BGA packages. In addition, the redistribution layer can also provide embedded passives as well as antenna structures using a multi-layer structure. It can be used for multi-chip packages for system-in-package (SiP) and heterogeneous integration. For higher productivity and resulting lower cost, larger mold embedding form factors are forecast for the near future. Besides, an increasing wafer diameter as an alternative option would lead to panel sizes which result to fan-out panel level packaging (FOPLP).

However, there are conventional problems if a core is used. There is a warpage problem caused by the core during the HVM manufacturing process. Furthermore, there is a yield drop risk in the core processing.

SUMMARY

There may be a need to provide a component carrier and a method of manufacturing the same, which can avoid warpage of the component carrier and achieve a high yield.

In order to achieve the object defined above, a component carrier and a method of manufacturing the same according to the independent claims are provided.

According to an exemplary embodiment of the invention, a method of manufacturing a component carrier is provided. The method comprises: stacking and connecting a first component and a second component to one another to form a cluster; thereafter, inserting the cluster into a cavity of a base structure. Because of inserting the cluster into the cavity after stacking and connecting the first component and the second component to one another, a height difference between opposing lateral sidewalls of the cluster can be controlled before the same is inserted into the cavity. As a result, the planarity of the component carrier can be improved and warpage can be avoided.

According to another exemplary embodiment of the invention, a component carrier is provided. The component carrier comprises: a base structure having a cavity; and a cluster comprising a first component stacked and connected with a second component, wherein the cluster is arranged in the cavity. A height difference between opposing lateral sidewalls of the cluster is less than 15 µm. The small height difference of less than 15 µm and the reduced warping are achieved by stacking the first component onto the second component to form a cluster. Thereby, the cluster becomes thicker than a core according to the prior art. The small height difference of less than 15 µm can usually not be achieved by a manufacturing process where the second component is separately inserted into the cavity without the first component, and where the first component is then connected to the second component when the same is already placed into the cavity.

In all embodiments, a cluster is used which is thicker than a prior art core. Stacked chips achieve a multi functionality to improve the warpage issue during a FO-PLP manufacture using a HVM process. For a process capability of a via-to-die-pad alignment, a face down bonding for low-end chip and a face up bonding for high-end chip can be realized.

Overview of Embodiments

In the following, further exemplary embodiments of the present invention will be explained.

In one embodiment of the method, the first component has at least one pad face up and the second component has at least one pad face down.

In another embodiment of the method, at least one of the first component and the second component has at least one pad face up.

In one embodiment of the method, at least one of the first component and the second component has at least one pad face down.

In one embodiment of the method, the cluster comprising the first component and the second component is encapsulated in a common encapsulant. The encapsulating can be carried out by molding.

Compared with the conventional prior art, where components are arranged adjacent to each other in a plan view, the present invention enables a reduction of the molding area in the plan view and therefore makes the overall configuration more homogeneous.

In one embodiment of the method, the first component has another height than the second component.

In one embodiment of the method, one main surface of the first component is in alignment with one main surface of the second component within the cluster.

In one embodiment of the method, at least one of the first component and the second component is an active component, in particular a semiconductor chip.

In one embodiment of the method, the method further comprises arranging at least one passive component in the cavity. The passive component can be connected to the cluster before or after the same is inserted into the cavity.

In one embodiment of the method, a direct electric connection is established between the first component and at least one of the second component and an electrically conductive layer structure of the base structure.

In one embodiment of the method, the method further comprises connecting the base structure and the cluster by a filling medium, in particular by at least one of an adhesive and an at least partially uncured layer structure. Thereby, the planarity of the component carrier can be controlled.

In one embodiment of the method, prior to connecting the base structure and the cluster, a temporary carrier is connected to the base structure and the cluster, and after connecting the base structure and the cluster, the temporary carrier is removed.

In one embodiment of the method, after connecting the base structure and the cluster, at least one pad of at least one of the first component and the second component is electrically connected to an electrically conductive layer structure of the component carrier.

In one embodiment of the method, an angle between a main surface of the first component and an opposing main surface of the second component, at which main surfaces the first component and the second component are connected, is less than 10°, in particular less than 5°.

In one embodiment of the method, the first component and the second component are connected on wafer level. This is a so called Wafer-to-Wafer technology, where a first wafer comprising a plurality of first components is connected to a second wafer comprising a plurality of second components. After having connected both wafers, the first and second components are singularized to form the cluster. As a result, the manufacturing process can be facilitated. Alternatively, a so called Die-to-Wafer technology can be applied, where at least one die or an encapsulant including at least one die is attached to a wafer.

In one embodiment of the component carrier, the first component has at least one pad face up and the second component has at least one pad face down.

In one embodiment of the component carrier, at least one of the first component and the second component has at least one pad face up.

In one embodiment of the component carrier, at least one of the first component and the second component has at least one pad face down.

In one embodiment of the component carrier, the cluster comprising the first component and the second component is encapsulated in a common encapsulant. The encapsulant can be a mold compound.

In one embodiment of the component carrier, the first component has another height than the second component.

In one embodiment of the component carrier, one main surface of the first component is in alignment with one main surface of the second component within the cluster.

In one embodiment of the component carrier, at least one of the first component and the second component is an active component, in particular a semiconductor chip.

In one embodiment of the component carrier, the same further comprises at least one passive component in the cavity.

In one embodiment of the component carrier, a direct electric connection is established between the first component and at least one of the second component and an electrically conductive layer structure of the base.

In one embodiment of the component carrier, the base structure and the cluster are connected by a filling medium, in particular by at least one of an adhesive and an at least partially uncured layer structure.

In one embodiment of the component carrier, an angle between a main surface of the first component and an opposing main surface of the second component, at which main surfaces the first component and the second component are connected, is less than 10°, in particular is less than 5°.

In one embodiment of the component carrier, the first component and the second component are connected on a wafer level.

In one embodiment of the component carrier, at least one of the first component and the second component, in particular an electronic component, is mounted on and/or embedded in at least one electrically insulating layer structure and/or at least one electrically conductive layer structure of the cavity of the base structure.

The component carrier according to the present invention can comprising at least one of the following features: the component carrier comprises at least one component being sur-face mounted on and/or embedded in the component carrier, wherein the at least one component is in particular selected from a group consisting of an electronic component, an electrically non-conductive and/or electrically conductive inlay, a heat transfer unit, a light guiding element, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier, and a logic chip; wherein at least one of the electrically conductive layer structures of the component carrier comprises at least one of the group consisting of copper, aluminum, nickel, silver, gold, palladium, and tungsten, any of the mentioned materials being optionally coated with supra-conductive material such as graphene; wherein the electrically insulating layer structure comprises at least one of the group consisting of resin, in particular reinforced or non-reinforced resin, for instance epoxy resin or Bismaleimide-Triazine resin, FR-4, FR-5, cyanate ester, polyphenylene derivate, glass, prepreg material, polyimide, polyamide, liquid crystal polymer, epoxy-based Build-Up Film, polytetrafluoroethylene, a ceramic, and a metal oxide; wherein the component carrier is shaped as a plate; wherein the component carrier is configured as one of the group consisting of a printed circuit board, a substrate, and an interposer; wherein the component carrier is configured as a laminate-type component carrier.

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) or a photo-imageable or dry-etchable organic material like epoxy-based build-up films or polymer compounds like polyimide, polybenzoxazole, or benzocyclobutene.

In an embodiment, the at least one electrically insulating layer structure comprises at least one of the group consisting of resin (such as rein-forced or non-reinforced resins, for instance epoxy resin or Bismaleimide-Triazine resin), cyanate ester, polyphenylene derivate, glass (in particular glass fibers, multi-layer glass, glass-like materials), prepreg material (such as FR-4 or FR-5), polyimide, polyamide, liquid crystal polymer (LCP), epoxy-based Build-Up Film, polytetrafluoroethylene (Teflon), a ceramic, and a metal oxide. Reinforcing materials such as webs, fibers or spheres, for example made of glass (multilayer glass) may be used as well. Although prepreg particularly FR4 are usually preferred for rigid PCBs, other materials in particular epoxy-based build-up film for substrates may be used as well. For high frequency applications, high-frequency materials such as polytetrafluoroethylene, liquid crystal polymer and/or cyanate ester resins, low temperature cofired ceramics (LTCC) or other low, very low or ultra-low DK-materials may be implemented in the component carrier as electrically insulating layer structure.

In an embodiment, the at least one electrically conductive layer structure comprises at least one of the group consisting of copper, aluminum, nickel, silver, gold, palladium, and tungsten. Although copper is usually preferred, other materials or coated versions thereof are possible as well, in particular coated with supra-conductive material such as graphene.

The at least one component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element or a ferrimagnetic element, for instance a ferrite core) or may be a paramagnetic element. However, the component may also be a substrate, an interposer or a further component carrier, for example in a board-in-board configuration. The component may be surface mounted on the component carrier and/or may be embedded in an interior thereof. Moreover, also other components, in particular those which generate and emit electro-magnetic radiation and/or are sensitive with regard to electromagnetic radiation propagating from an environment, may be used as component.

In an embodiment, the component carrier is a laminate-type component carrier. In such an embodiment, the component carrier is a compound of multiple layer structures which are stacked and connected together by applying a pressing force and/or heat.

In the context of the present application, the term "nano- and/or microstructures" may particularly denote physical structures with dimensions in the range of nanometers to micrometers, in particular having dimensions in a range between 0.1 nm and 10 µm, more particularly in a range between 1 nm and 500 nm. A sheet having a surface equipped with such nano- and/or microstructures, for instance in an ordered way (for example in rows and columns) or in a random way, may provide specific properties in terms of adhesion with adjacent component carrier material. Depending on the material, shape, dimension, coating and arrangement of the nano- and/or microstructures on the sheet surface, the nano- and/or microstructures may have an adhesive effect (such as at a leg of a gecko) or a repellent effect (such as on a surface of a lotus flower). A sheet may have at least 100, in particular at least 1000, nano- and/or microstructures. For instance, a sheet with nanostructures providing an adhesive property may be converted into a sheet with nanostructures providing a non-adhesive or even repellent property by a corresponding surface coating of the nano- and/or microstructures (for instance with a waxy material). For instance, the nano- and/or microstructures may be nano- and/or microprotrusions and/or nano- and/or microindentations.

According to an exemplary embodiment of the invention, a sheet with nano- and/or microstructures may be integrated in a component carrier such as a printed circuit board. By taking this measure, the specific adhesive properties of a sheet with nano- and/or microstructures may be advantageously used for simplifying manufacturing a component carrier and connection thereof with another body, a component to be surface-mounted thereon or embedded therein, etc. This allows to manufacture the component carrier with low effort and to connect or disconnect it selectively with another body. Due to the high flexibility of adjusting the adhesive properties (i.e. to be adhering or repellent) depending on the properties of the nano- and/or microstructures, a board designer has a high freedom of adjusting the interconnection properties within the component carrier and/or between the component carrier in relation to a further body. Highly advantageously, such a sheet with nano- and/or microstructures may be dry so that the implementation of liquids, chemicals, etc. for establishing adhering or repellent functions may become dispensable.

The aspects defined above and further aspects of the invention are apparent from the examples of embodiment to be described hereinafter and are explained with reference to these examples of embodiment.

DETAILED DESCRIPTION OF ILLUSTRATED EMBODIMENTS

Figure 1:
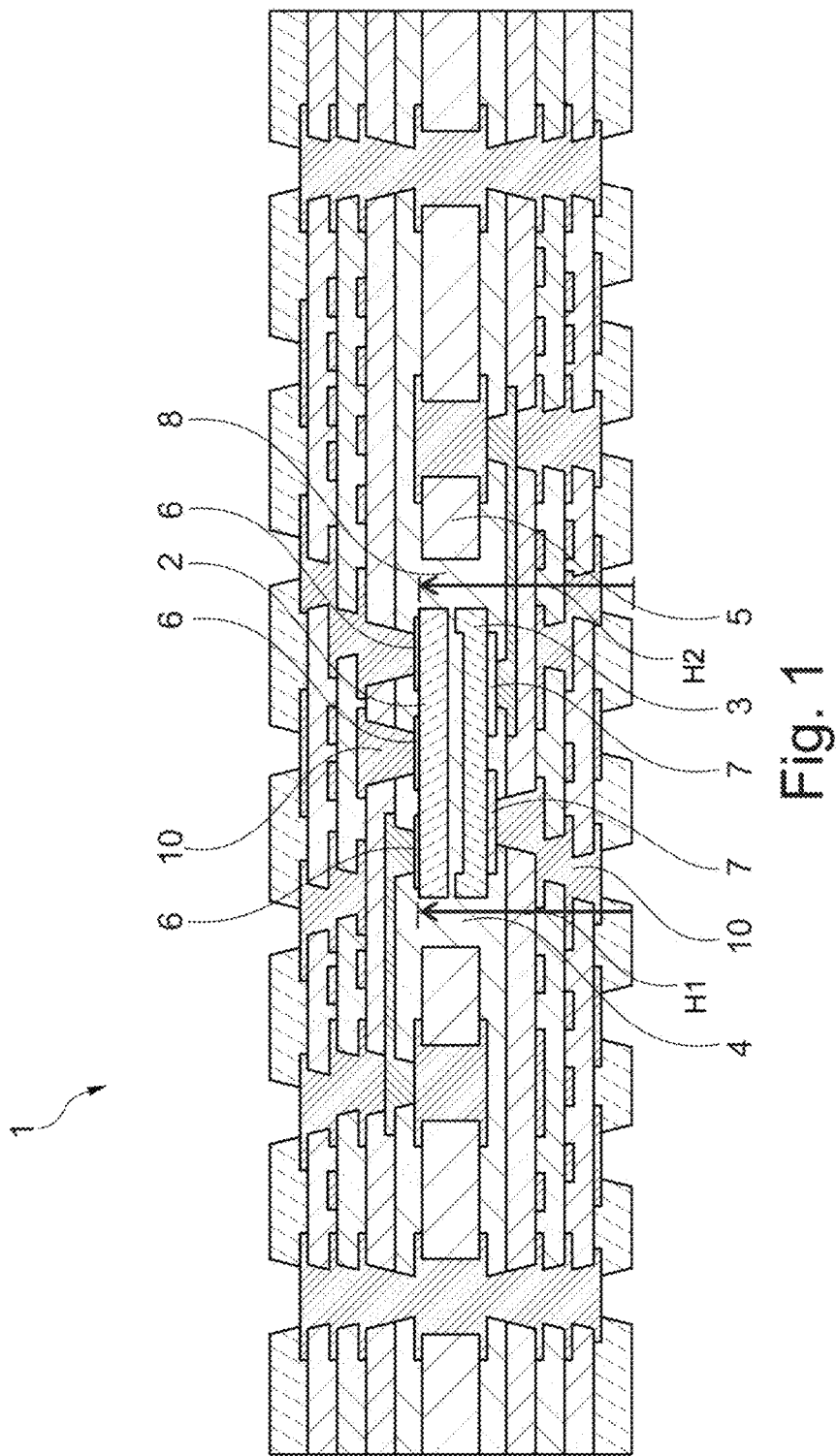
FIG. 1 illustrates a cross-sectional view of a preform of a component carrier being presently under manufacture according to an exemplary embodiment of the invention.

The aspects defined above and further aspects of the invention are apparent from the examples of embodiment to be described hereinafter and are explained with reference to these examples of embodiment.

The illustrations in the drawings are schematically presented. In different drawings, similar or identical elements are provided with the same reference signs.

Before, referring to the drawings, exemplary embodiments will be de-scribed in further detail, some basic considerations will be summarized based on which exemplary embodiments of the invention have been developed.

According to an exemplary embodiment, a nano-coated structure may be used for component carrier technology, in particular as a dry-adhesive structure. An adhesive layer implementing such a surface configuration may also be denoted as gecko film. The adhesive effect of such a surface may be based on van der Waals forces. Descriptively speaking, a plurality of low dimensioned suction cups may be formed by such a concept. According to an exemplary embodiment of the invention, a reliable substrate and/or structured material is provided for embedding and/or surface mounting applications having specific adhesion properties due to a corresponding configuration of nano- and/or microstructures on this surface. Exemplary embodiments have the advantage that the mentioned adjustability of the surface adhesion properties may be obtained with low material consumption, low production costs, small contamination risk, and high process reliability.

In an embodiment, the mentioned materials may be used as support for component placement in embedding technologies. Compared to a traditional adhesive tape system that is depending on temperature and time, an exemplary embodiment uses the surface of a support (which may be rigid or flexible) or a PCB elements (such as cores, prepregs, copper foils, etc.), that exhibits, thanks to the nano- and/or microstructures, van der Waals attraction forces, a gecko effect, a high grip, and that is dry and thus can be cleaned and reused. A sheet with nano- and/or microstructures can also be included in the final product. When used for an embedding concept, components may be placed on the dry surface and can be held in position by weak bonds (like van der Waals forces, gecko effect, high grip values) prior to the component lamination.

Such an architecture allows to obtain a dry interaction between the component and the holding substrate. No additional liquid adhesive is required. This has the advantages of a dry interaction, and a reduction of risk of contamination from the substrate.

FIG. 1 illustrates a cross-sectional view of a preform of a component carrier 1 being presently under manufacture according to an exemplary embodiment of the invention.

The component carrier 1 comprises a base structure 5 having a cavity 4, and a cluster 2, 3 comprising a first component 2 stacked and connected with a second component 3, wherein the cluster 2, 3 is arranged in the cavity 4. The cluster 2, 3 may have a height larger than 200 µm.

In addition, the component carrier 1 can further comprise a passive component in the cavity 4.

The first component 2 and the second component 3 can be an active component, in particular a semiconductor chip. For example, one of the first and second components 2, 3 can be a processor chip, while the other one of the first and second components 2, 3 can be a memory chip. The first component 2 and the second component 3 can be connected on a wafer level. A main surface of the first component 2 is in alignment with one main surface of the second component 3 within the cluster 2, 3. An angle between a main surface of the first component 2 and an opposing main surface of the second component 3, at which main surfaces the first component 2 and the second component 3 are connected, is less than 10°, in particular is less than 5°. A height difference between opposing lateral sidewalls of the cluster 2, 3 is less than 15 µm, particularly less than 5 µm. If the first component 2 and the second component 3 are connected on wafer level, the height difference between opposing lateral sidewalls of the cluster 2, 3 can be less than 1 µm, particularly less than 500 nm, more particularly less than 100 nm.

Although not visible in FIG. 1, the first component 2 may have another height than the second component 3.

The first component 2 has three pads 6 face up and the second component 3 has two pads 7 face down.

The cluster 2, 3 comprising the first component 2 and the second component 3 and the passive component, if any, is encapsulated in a common encapsulant 8. The encapsulant 8 is a mold compound.

Alternatively, the base structure 5 and the cluster 2, 3 can be connected by a filling medium 11 (cf. FIG. 2), in particular by at least one of an adhesive 13 and an at least partially uncured layer structure.

A direct electric connection is established between the first component 2 and the second component 3. Further, a direct electric connection is also established between the first component 2 and an electrically conductive layer structure 10 of the base structure 5.

Figure 2:
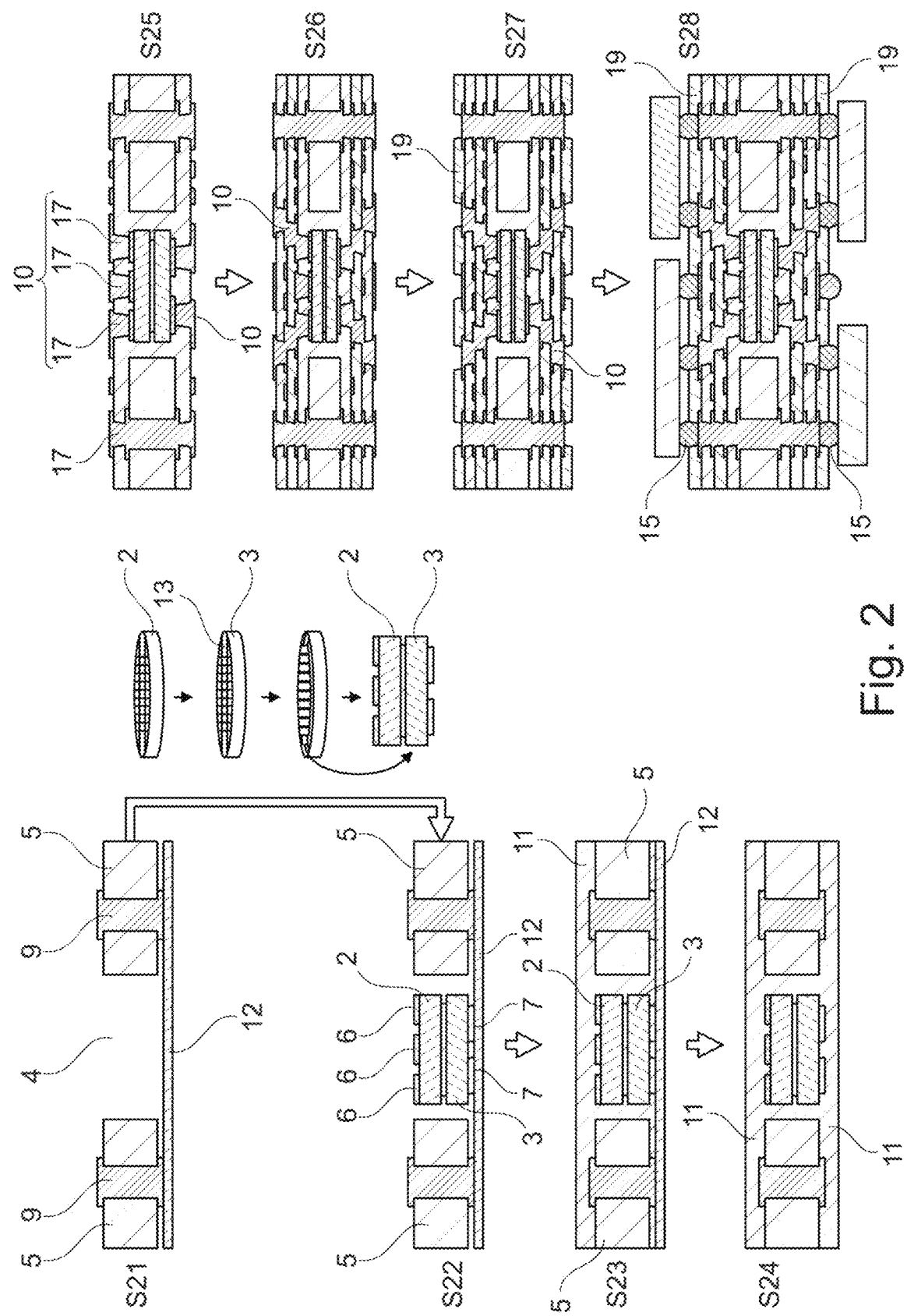
FIG. 2 illustrates a method of manufacturing a component carrier according to an embodiment of the invention.

FIG. 2 illustrates a method of manufacturing a component carrier 1 according to an embodiment of the invention.

In a step S21, a temporary carrier 12 is connected to a base structure 5 having vias 9. Then, a cavity 4 is formed into the base structure 5.

In a step S22, a cluster 2, 3 is inserted into the cavity 4. The cluster 2, 3 has been prepared beforehand by stacking and connecting a first component 2 and a second component 3 to one another to form the cluster 2, 3. Because of inserting the cluster 2, 3 into the cavity 4 after having stacked and connected the first component 2 and the second component 3 to one another, a height difference between opposing lateral sidewalls of the cluster 2, 3 can be controlled before the same is inserted into the cavity 4. As a result, the planarity of the component carrier 1 can be improved and warpage can be avoided.

The first component 2 and the second component 3 are semiconductor chips, and they are connected on a wafer level so that the manufacturing process is facilitated. That means that a first wafer comprising a plurality of first components 2 is connected to a second wafer comprising a plurality of second components 3. After having connected both wafers, the first and second components 2, 3 are singularized to obtain the cluster 2, 3.

In the present embodiment, the first component 2 has been coupled to the second component 3 by means of an adhesive 13. By the use of the adhesive 13, possible height differences of the opposing lateral sidewalls of the cluster 2, 3 can be controlled or compensated for. One main surface of the first component 2 is in alignment with one main surface of the second component 3 within the cluster 2, 3. The first component 2 has been provided with three pads 6 face up, and the second component 3 has been provided with two pads 7 face down, as shown in FIG. 1. The cluster 2, 3 may have a height larger than 200 µm.

Although not visible in the figures, the first component 2 may have another height than the second component 3, and an angle between a main surface of the first component 2 and an opposing main surface of the second component 3, at which main surfaces the first component 2 and the second component 3 are connected, is less than 10°, in particular less than 5°.

It is possible that at least one passive component is additionally inserted in the cavity 4. The passive component can be connected to the cluster 2, 3 before the same is inserted into the cavity 4. However, the passive component and the cluster 2, 3 can also separately be inserted into the cavity 4.

In a step S23, the base structure 5 and the cluster 2, 3 are connected by a filling medium 11. The filling medium 11 can be an adhesive or a partially uncured layer structure. In the step S23, the filling medium 11 covers upper surfaces of the base structure 5 and the cluster 2, 3.

In a step S24, after having connected the base structure 5 and the cluster 2, 3, the temporary carrier 12 is removed or detaped. The filling medium 11 is then applied on the backside of the stack so that the filling medium 11 covers bottom surfaces of the base structure 5 and the cluster 2, 3.

In steps S25 through S28, the filling medium 11 is patterned to provide vias 17 therein, and further layers of electrically conductive materials and electrically insulating materials are built-up onto the so far manufactured stack of the component carrier 1. After having connected the base structure 5 and the cluster 2, 3, the pads 6, 7 of the first component 2 and the second component 3 are electrically connected to an electrically conductive layer structure 10 of the component carrier 1. In particular, not only the filling medium 11 but also the layers of electrically insulating material are patterned to form the vias 17 therein. The vias 17 are part of the electrically conductive layer structure 10. A direct electric connection is established between the first component 2 and the electrically conductive layer structure 10 of the base structure 5. A direct electric connection can also be established between the first component 2 and the second component 3. Several vias 17 can be bridged by at least one layer of electrically conductive material.

In the step S28, the component carrier 1 is further provided with soldering or bonding points 15. Such soldering or bonding points 15 can be bumps which are adapted to a flip-chip connection with other chips, which is described later. The soldering or bonding points 15 can be confined by a solder resist layer 19.

Figure 3:
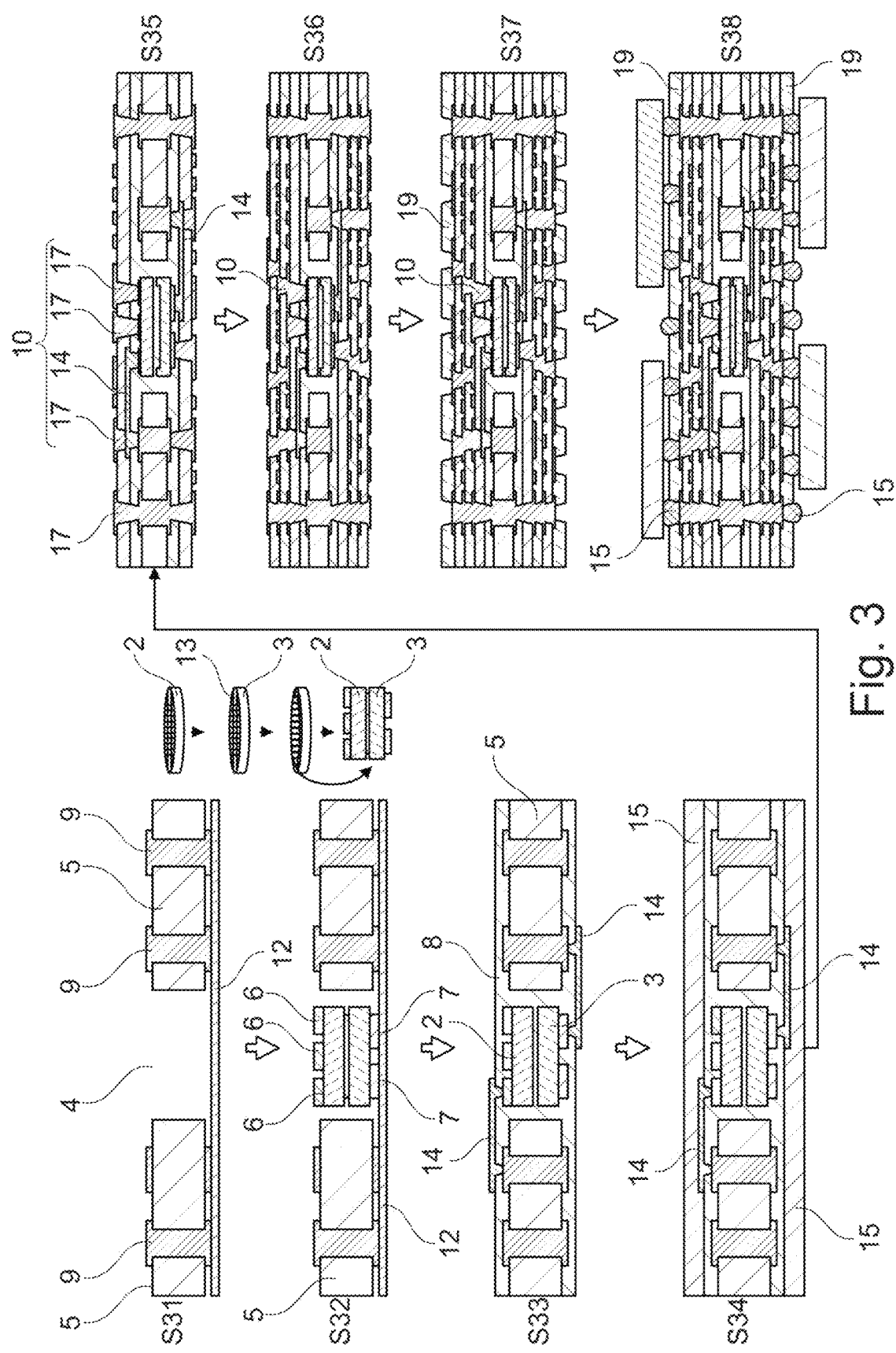
FIG. 3 illustrates a method of manufacturing a component carrier according to another embodiment of the invention.

FIG. 3 illustrates a method of manufacturing a component carrier 1 according to another embodiment of the invention.

In a step S31, a temporary carrier 12 is connected to a base structure 5 having vias 9. Then, a cavity 4 is formed into the base structure 5.

In a step S32, a cluster 2, 3 is inserted into the cavity 4. The cluster 2, 3 has been prepared beforehand by stacking and connecting a first component 2 and a second component 3 to one another to form a cluster 2, 3. The first component 2 and the second component 3 are semiconductor chips, and they are connected on wafer level. In the present embodiment, the first component 2 has been coupled to the second component 3 by means of an adhesive. One main surface of the first component 2 is in alignment with one main surface of the second component 3 within the cluster 2, 3. The first component 2 has been provided with three pads 6 face up, and the second component 3 has been provided with two pads 7 face down.

Although not visible in the figures, the first component 2 has another height than the second component 3, and an angle between a main surface of the first component 2 and an opposing main surface of the second component 3, at which main surfaces the first component 2 and the second component 3 are connected, is less than 10°, in particular less than 5°.

It is possible that at least one passive component is additionally inserted in the cavity 4.

In a step S33, the cluster 2, 3 comprising the first component 2 and the second component 3 is encapsulated in a common encapsulant 8, which is carried out as molding. In a first sub step, the upper part of the so far manufactured stack is molded. In a second sub step, the temporary carrier 12 is removed. In an optional third sub step, the bottom part of the so far manufactured stack is molded. Instead of the third sub step, bridges 14 can be formed between the electrically conductive layer structure 10 of the base structure 5 and the pads 7 of the second component 3.

Anyway in step S33, the encapsulant 8 can be patterned to form bridges 14 between the electrically conductive layer structure 10 of the base structure 5 and the pads 6, 7 of the first and second components 2, 3, and/or between the vias 9 and the pads 6, 7 of the first and second components 2, 3. The bridges 14 comprise at least one horizontal portion and two vertical portions. The bridges 14 may comprise only the horizontal portion.

In a step S34, a layer 15 of an electrically insulating material is applied on both sides of the encapsulant 8, thereby embedding the bridges 14.

In steps S35 through S38, the layer 15 of an electrically insulating material is patterned to form vias 17 therein. Further layers of electrically conductive material and layers of electrically insulating material are built-up onto the so far manufactured stack of the component carrier 1. After having connected the base structure 5 and the cluster 2, 3, the pads 6, 7 of the first component 2 and the second component 3 are electrically connected to an electrically conductive layer structure 10 of the component carrier 1. In particular, the vias 17 are formed in the layers of electrically insulating material. Such vias 17 are connected to the layers of electrically conductive material and the bridges 14. A direct electric connection is thus established between the first component 2 and the electrically conductive layer structure 10 of the base structure 5. A direct electric connection can also be established between the first component 2 and the second component 3. The component carrier 1 is further provided with soldering or bonding points 15. Such soldering or bonding points 15 can be bumps which are adapted to a flip-chip connection with other chips, which is described later. The soldering or bonding points 15 can be confined by a solder resist layer 19.

Figure 4:
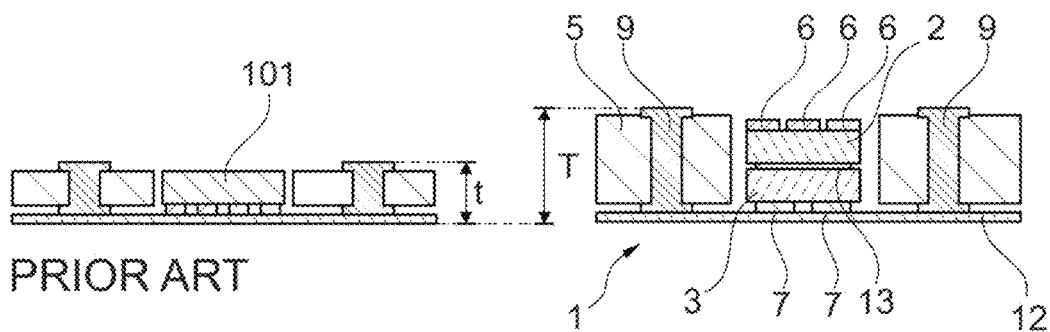
FIG. 4 illustrates a cross-sectional view of a schematic preform of a component carrier according to an exemplary embodiment of the invention.

FIG. 4 illustrates a cross-sectional view of a schematic preform of a component carrier according to an exemplary embodiment of the invention.

In this embodiment, only the cluster 2, 3, the base structure 5 and the temporary carrier 12 are depicted. The left-hand picture in FIG. 4 shows a component carrier according to the prior art, while the right-hand picture in FIG. 4 shows a component carrier 1 according to the present invention. The prior art component carrier includes a core 101 instead of a cluster. The height of the core 101 is usually less than 110 μm. In contrast thereto, the height of the cluster 2, 3 of the component carrier 1 according to the present invention can be more than 200 μm. Advantageously, the present invention enables an easier HVM process handling because of the thicker cluster 2, 3 (CCE core).

In the prior art, the core may be tilted within the cavity so that there is a remarkable height difference between opposing lateral sidewalls of the core. In contrast thereto, the cluster 2, 3 according to the present invention is inserted into the cavity after having stacked the first component 2 to the second component 3. Moreover, the adhesive between the first component 2 and the second component 3 can adjust and compensate for a possible height difference between opposing lateral sidewalls of the cluster 2, 3. As a result, the planarity of the component carrier 1 is improved, warpage is avoided and the height difference between opposing lateral sidewalls of the cluster 2, 3 is less than 15 μm.

Figure 5:
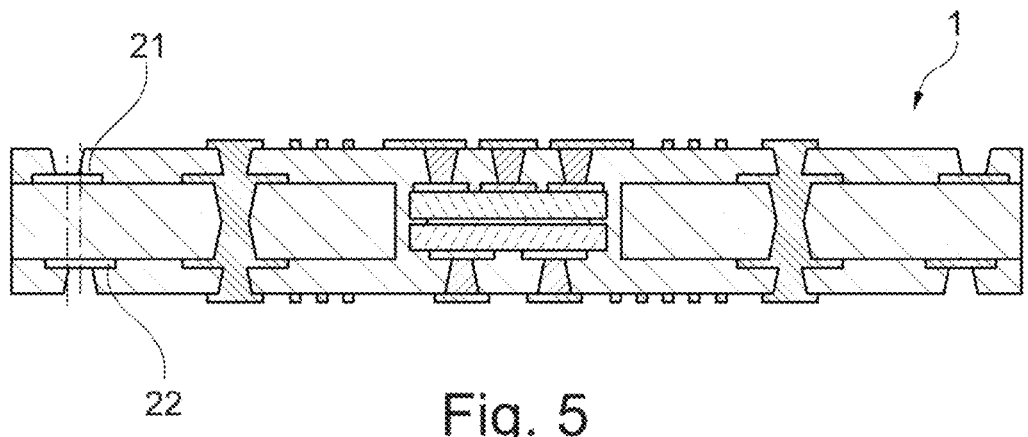
FIG. 5 illustrates a cross-sectional view of a schematic preform of a component carrier according to an exemplary embodiment of the invention.

FIG. 5 illustrates a cross-sectional view of a schematic preform of a component carrier according to another exemplary embodiment of the invention. The first component 2 is a high-end chip, where face-up bonding is performed with the high-end chip 2. The second component 3 is a low-end chip, where face-down bonding is performed with the low-end chip 3. A high process capability for via to die pad alignment can be achieved. A first reference pad 21 is embedded in the filling medium 11 and exposed to the front side (upper side of the component carrier 1) through a through-hole which is formed in the filling medium 11. A second reference pad 22 is embedded in the filling medium 11 and exposed to the back side (bottom side of the component carrier 1) through a through-hole which is formed in the filling medium 11. The position of the first and second reference pads 21, 22 is measured, for example by optical (for example X-ray), inductive or capacitive detection. The first reference pad 21 is used for chip bonding and the formation of the vias at the front side. The second reference pad 22 is used for the formation of the vias at the back side.

Figure 6:
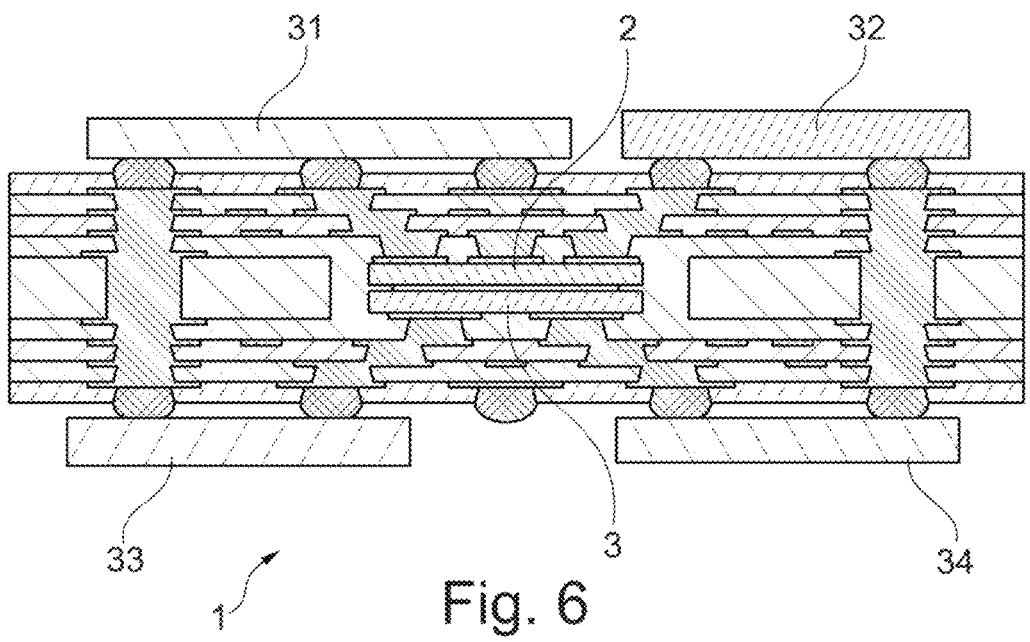
FIG. 6 illustrates a cross-sectional view of a schematic preform of a component carrier according to an exemplary embodiment of the invention.

FIG. 6 illustrates a cross-sectional view of a schematic preform of a component carrier according to another exemplary embodiment of the invention. Two chips 31, 32 are bonded at the front side of the component carrier 1, while two chips 33, 34 are bonded at the back side of the component carrier 1. Thereby, the component carrier 1 achieves a multi functionality by the stacked chips 31, 32, 33, 34, which progresses to FO-SiB (for example AP+Memory, AP+PMIC, etc.).

Figure 7:
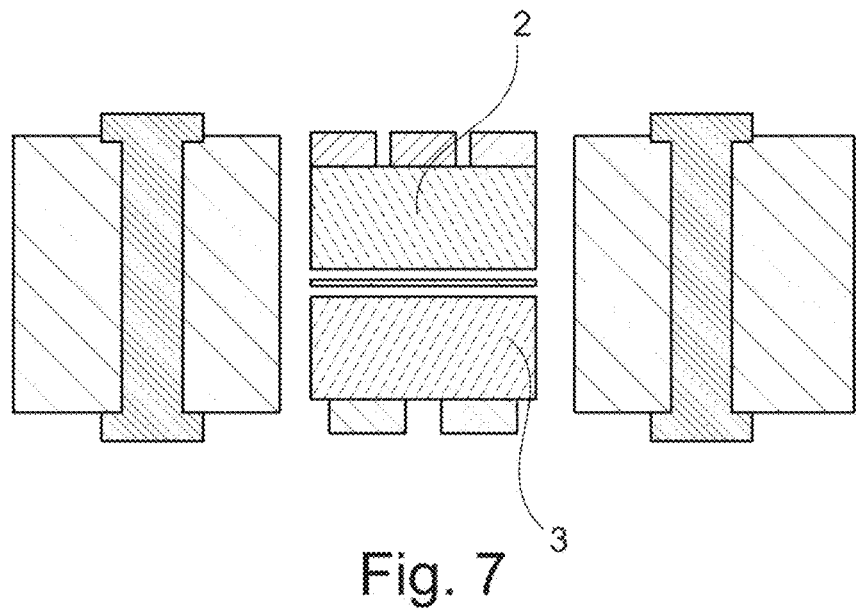
FIG. 7 illustrates a cross-sectional view of a schematic preform of a component carrier according to an exemplary embodiment of the invention.

FIG. 7 illustrates a cross-sectional view of a schematic preform of a component carrier according to another exemplary embodiment of the invention. In this embodiment, only stacked chips 2, 3 are used to form a cluster.

Figure 8:
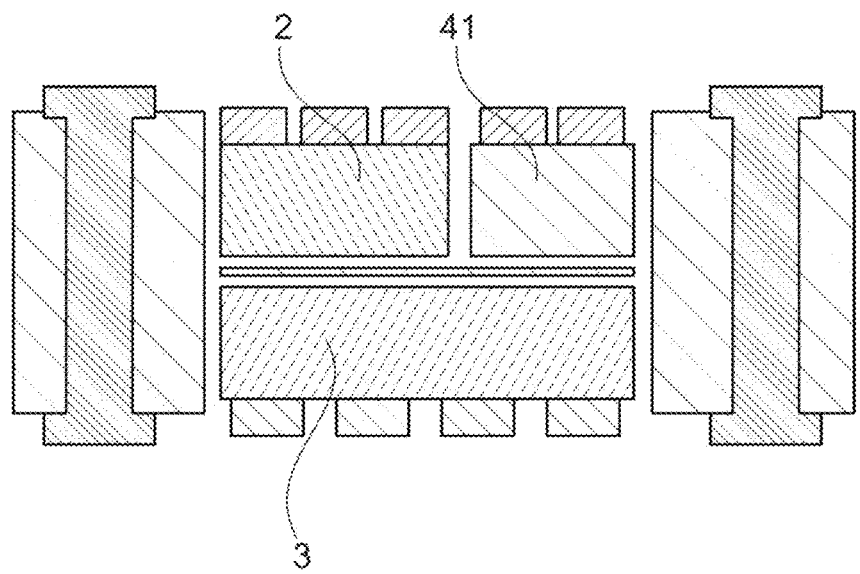
FIG. 8 illustrates a cross-sectional view of a schematic preform of a component carrier according to an exemplary embodiment of the invention.

FIG. 8 illustrates a cross-sectional view of a schematic preform of a component carrier according to another exemplary embodiment of the invention. In this embodiment, the cluster is formed by the first component 2, the second component 3 and a third component 41 which is arranged adjacent to the first component 2 and adhered onto the second component 3.

Figure 9:
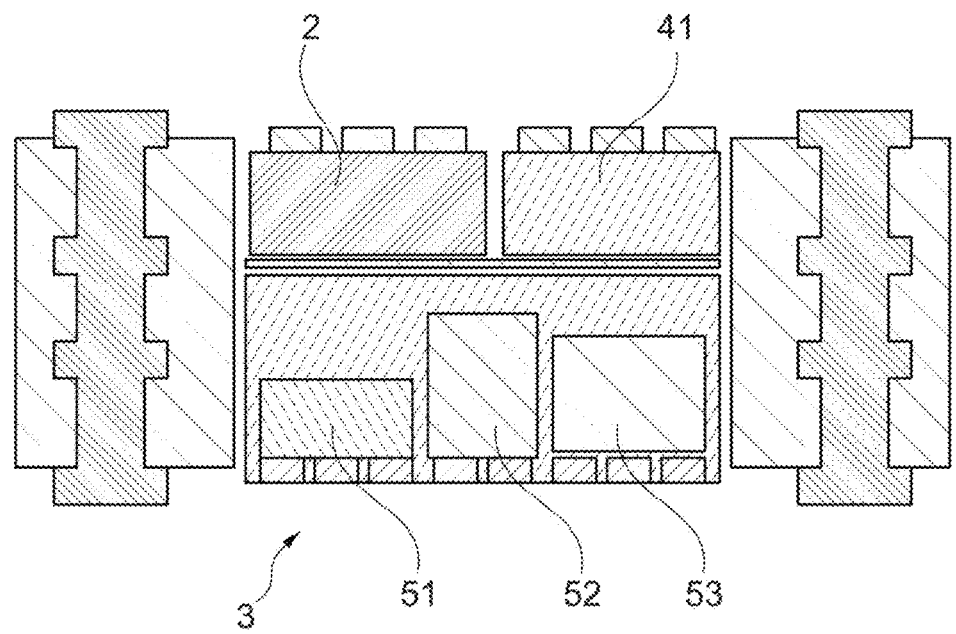
FIG. 9 illustrates a cross-sectional view of a schematic preform of a component carrier according to an exemplary embodiment of the invention.

FIG. 9 illustrates a cross-sectional view of a schematic preform of a component carrier according to another exemplary embodiment of the invention. In this embodiment, the cluster is formed by the first component 2, the second component 3 and the third component 41 which is arranged adjacent to the first component 2 and adhered onto the second component 3. The second component 3 in turn comprises three chips 51, 52, 53 which are embedded in an encapsulant. The second component 3 is a so called "cluster chip". Thus, the cluster in the embodiment comprises the stacked multi chips 2, 3, 41, wherein the cluster chip 3 formed by the chips 51, 52, 53.

Figure 10:
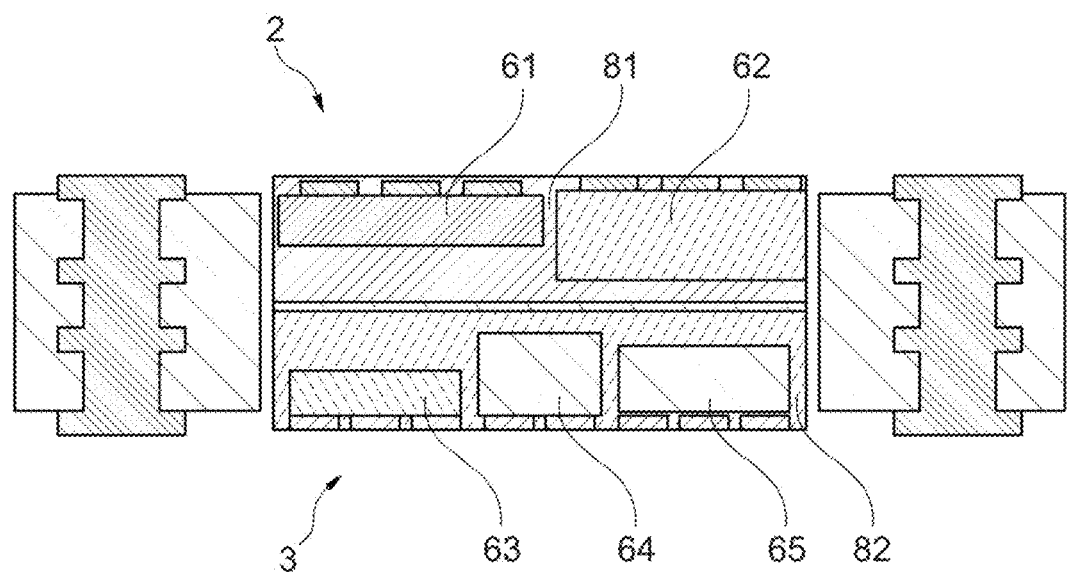
FIG. 10 illustrates a cross-sectional view of a schematic preform of a component carrier according to an exemplary embodiment of the invention.

FIG. 10 illustrates a cross-sectional view of a schematic preform of a component carrier according to another exemplary embodiment of the invention. In this embodiment, the cluster is formed by the first component 2 and the second component 3. The first component 2 comprises two chips 61, 62, which are embedded in a first encapsulant 81. The second component 3 comprises three chips 63, 64, 65 which are embedded in a second encapsulant 82. The first component 2 and the second component 3 are both so called "cluster chips". Thus, the cluster in the embodiment comprises the cluster chip 2 formed by the chips 61, 62 and the cluster chip 3 formed by the chips 63, 64, 65. The cluster 2, 3 forms a stacked cluster chip.

In summary, the present invention achieves an optimized space of the embedded area, the component carrier 1 is flatter and less encapsulant material 8 flows in. The dimple amount of the encapsulant 8 can be reduced. Furthermore, the planarity of the component carrier 1 is improved, i.e. it has a flatter surface without image transfer/undulations.

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants are possible which use the solutions shown and the principle according to the invention even in the case of fundamentally different embodiments.

The present invention is particularly applicable for FO-PLPs for mobile phones and related to electronic devices.

The invention claimed is:

1. A method of manufacturing a component carrier, comprising:
   stacking and connecting a first component and a second component to one another to form a cluster;
   thereafter, inserting the cluster into a cavity of a base structure;
   wherein a direct electric connection is established between the first component and at least one of the second component and an electrically conductive layer structure of the base structure.

2. The method according to claim 1, comprising at least one of the following features:
   the first component has at least one pad face up and the second component has at least one pad face down;
   at least one of the first component and the second component has at least one pad face up;
   at least one of the first component and the second component has at least one pad face down.

3. The method according to claim 1, wherein the cluster comprising the first component and the second component is encapsulated in a common encapsulant.

4. The method according to claim 1, comprising at least one of the following features:
   one main surface of the first component is in alignment with one main surface of the second component within the cluster;
   at least one of the first component and the second component is an active component;
   the method further comprises arranging at least one passive component in the cavity.

5. The method according to claim 1, wherein the method further comprises:
   connecting the base structure and the cluster by a filling medium.

6. The method according to claim 1, wherein, prior to connecting the base structure and the cluster, a temporary carrier is connected to the base structure and the cluster, and after connecting the base structure and the cluster, the temporary carrier is removed.

7. The method according to claim 1, wherein, after connecting the base structure and the cluster, at least one pad of at least one of the first component and the second component is electrically connected to an electrically conductive layer structure of the component carrier.

8. A method of manufacturing a component carrier, comprising:
   stacking and connecting a first component and a second component to one another to form a cluster;
   thereafter, inserting the cluster into a cavity of a base structure, wherein an angle between a main surface of the first component and an opposing main surface of the second component, at which main surfaces the first component and the second component are connected, is less than 10°.

9. The method of claim 8, further comprising at least one of the following steps:
   arranging the cluster in an encapsulant;
   arranging at least one passive component in the cavity.

10. The method of claim 8, further comprising:
    connecting the base structure and the cluster by at least one of an adhesive and an uncured layer structure.

11. The method of claim 10, further comprising:
    wherein, after connecting the base structure and the cluster, at least one pad of at least one of the first component and the second component is electrically connected to an electrically conductive layer structure of the component carrier.

12. A component carrier, comprising:
    a base structure having a cavity; and
    a cluster comprising a first component stacked and connected with a second component, wherein the cluster is arranged in the cavity;
    wherein a height difference between opposing lateral sidewalls of the cluster is less than 15 µm.

13. The component carrier according to claim 12, comprising at least one of the following features:
    the first component has at least one pad face up and the second component has at least one pad face down;
    at least one of the first component and the second component has at least one pad face up;
    at least one of the first component and the second component has at least one pad face down.

14. The component carrier according to claim 12, wherein the cluster comprising the first component and the second component is encapsulated in a common encapsulant.

15. The component carrier according to claim 12, comprising at least one of the following features:
    one main surface of the first component is in alignment with one main surface of the second component within the cluster;
    at least one of the first component and the second component is an active component;
    the component carrier further comprising at least one passive component in the cavity.

16. The component carrier according to claim 12, wherein a direct electric connection is established between the first component and at least one of the second component and an electrically conductive layer structure of the base structure.

17. The component carrier according to claim 12, wherein the base structure and the cluster are connected by a filling medium.

18. The component carrier according to claim 12, wherein an angle between a main surface of the first component and an opposing main surface of the second component, at which main surfaces the first component and the second component are connected, is less than 10°.

19. The component carrier according to claim 12, wherein a height difference between opposing lateral sidewalls of the cluster is less than 1 µm.

20. The component carrier according to claim 12, wherein at least one of the first component and the second component is mounted on and/or embedded in at least one electrically insulating layer structure and/or at least one electrically conductive layer structure of the cavity of the base structure.

21. The component carrier according to claim 12, comprising at least one of the following features:

the component carrier comprises at least one component being surface mounted on and/or embedded in the component carrier, wherein the at least one component is selected from a group consisting of an electronic component, an electrically non-conductive and/or electrically conductive inlay, a heat transfer unit, a light guiding element, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier, and a logic chip;

wherein at least one of the electrically conductive layer structures of the component carrier comprises at least one of the group consisting of copper, aluminum, nickel, silver, gold, palladium, and tungsten;

wherein the electrically insulating layer structure comprises at least one of the group consisting of resin, reinforced or non-reinforced resin, epoxy resin or Bismaleimide-Triazine resin, FR-4, FR-5, cyanate ester, polyphenylene derivate, glass, prepreg material, polyimide, polyamide, liquid crystal polymer, epoxy-based Build-Up Film, polytetrafluoroethylene, a ceramic, and a metal oxide;

wherein the component carrier is shaped as a plate;

wherein the component carrier is configured as one of the group consisting of a printed circuit board, a substrate, and an interposer;

wherein the component carrier is configured as a laminate-type component carrier.

* * * * *